United States Patent
Kramer et al.

(10) Patent No.: US 8,933,346 B1
(45) Date of Patent: Jan. 13, 2015

(54) MINIATURE SURFACE MOUNT TECHNOLOGY ELECTROMAGNETIC INTERFERENCE SHIELDING DEVICE

(75) Inventors: John F. Kramer, Satellite Beach, FL (US); Joseph M. Strenecky, Melbourne, FL (US); Nathaniel T. Gould, Melbourne, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 520 days.

(21) Appl. No.: 12/891,990

(22) Filed: Sep. 28, 2010

(51) Int. Cl.
*H05K 9/00* (2006.01)
*H01R 4/66* (2006.01)
*H01R 13/648* (2006.01)

(52) U.S. Cl.
USPC .......... 174/355; 174/354; 174/390; 361/816; 361/818; 439/95

(58) Field of Classification Search
CPC . H05K 9/0015; H05K 9/0016; H05K 9/0032; H05K 9/0039; H05K 9/0062; H01R 13/658
USPC .......... 174/354, 355, 384, 390, 350; 361/818, 361/816; 439/92, 654, 818, 95; D13/133
See application file for complete search history.

(56) References Cited

U.S. PATENT DOCUMENTS

| | | | | |
|---|---|---|---|---|
| 2,065,908 A | * | 12/1936 | Pihl | 220/326 |
| 3,504,095 A | * | 3/1970 | Roberson et al. | 174/355 |
| 5,015,802 A | * | 5/1991 | Chi | 174/354 |
| 5,043,528 A | * | 8/1991 | Mohr | 174/355 |
| 5,354,951 A | * | 10/1994 | Lange et al. | 361/818 |
| 5,746,326 A | * | 5/1998 | Hong | 361/800 |
| 5,952,608 A | * | 9/1999 | Kim | 174/354 |
| 6,049,963 A | * | 4/2000 | Boe | 361/747 |
| 6,051,781 A | * | 4/2000 | Bianca et al. | 174/351 |
| 6,149,443 A | * | 11/2000 | Moran | 439/66 |
| 6,178,091 B1 | * | 1/2001 | Mills et al. | 174/545 |
| 6,264,480 B1 | * | 7/2001 | Nealis et al. | 439/92 |
| 6,500,012 B1 | * | 12/2002 | Billenstein et al. | 439/92 |
| 6,867,984 B2 | * | 3/2005 | Chen | 439/66 |
| 7,167,379 B2 | * | 1/2007 | DiBene et al. | 439/66 |
| 2003/0121687 A1 | * | 7/2003 | Chen | 174/35 GC |

OTHER PUBLICATIONS

Definition of "cylinder" from www.dictionary.com Jun. 23, 2014.*
Definition of "cylinder" from www.wikipedia.org Jun. 23, 2014.*

* cited by examiner

*Primary Examiner* — Chau N Nguyen
*Assistant Examiner* — Roshn Varghese
(74) *Attorney, Agent, or Firm* — Angel N. Gerdzhikov; Donna P. Suchy; Daniel M. Barbieri

(57) ABSTRACT

The present invention is directed to an electromagnetic interference (EMI) shielding device. The EMI shielding device may be formed of a material (ex.—Beryllium Copper) having a thickness which allows the shielding device to provide a desired range of compression. Further, the EMI shielding device may be constructed for accommodating tolerances and compression forces which may be encountered in various implementation environments. Further, the EMI shielding device may be sized and shaped for promoting compatibility of the EMI shielding device with Surface Mount Technology (SMT) processes.

8 Claims, 4 Drawing Sheets

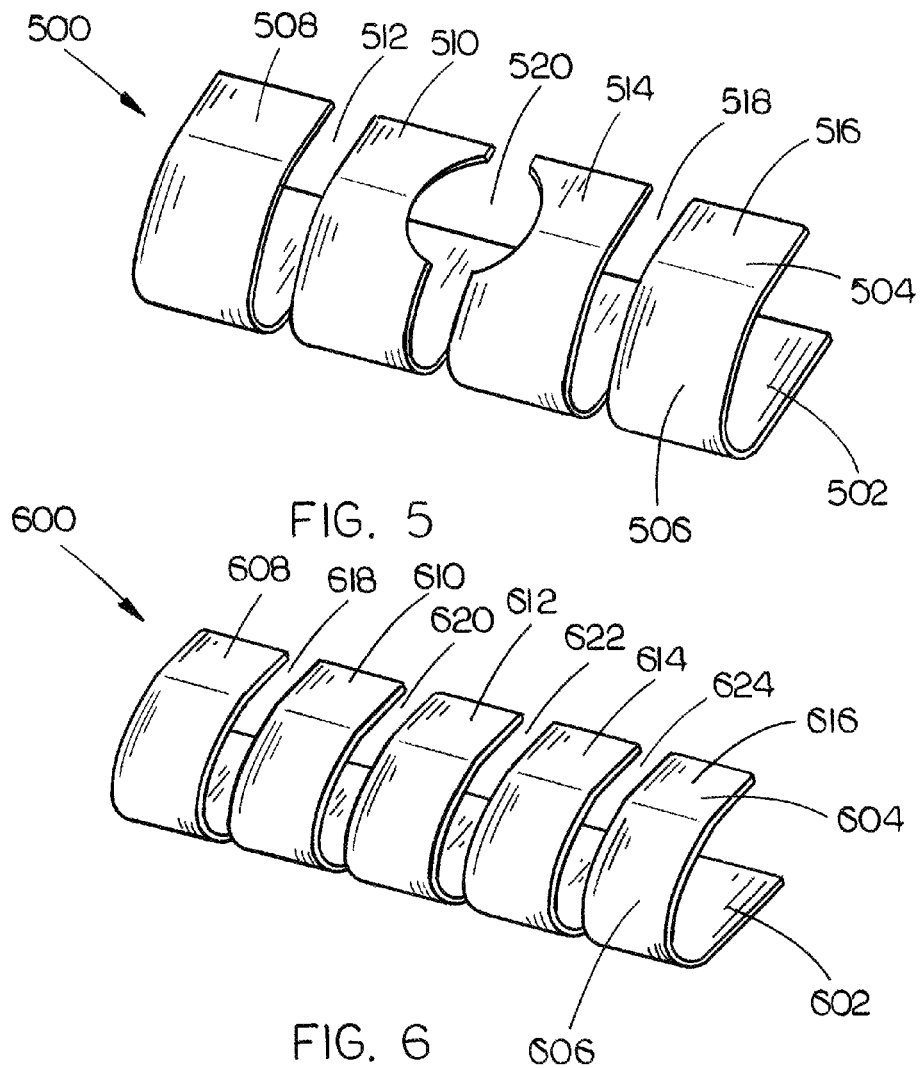
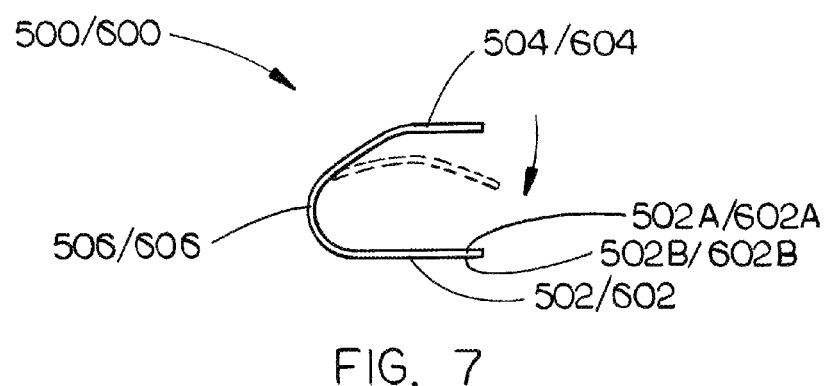

MINIATURE SURFACE MOUNT TECHNOLOGY ELECTROMAGNETIC INTERFERENCE SHIELDING DEVICE

FIELD OF THE INVENTION

The present invention relates to the field of low cost avionics, and more particularly, to a miniature surface mount technology (SMT) electromagnetic interference (EMI) shielding device.

BACKGROUND OF THE INVENTION

Currently available electromagnetic interference (EMI) shielding solutions may exhibit one or more of the following characteristics: high material cost; inconsistent assembly processes; significant compression set; inconsistent performance following multiple open/closure cycles; continued material obsolescence; poor suitability for high temperature performance; galvanic incompatibility; large footprint; require complex cover geometry; require large compression force; and/or insufficient compression range.

Thus, it would be desirable to provide an EMI shielding solution which overcomes one or more of the above-referenced negative characteristics associated with currently available solutions.

SUMMARY OF THE INVENTION

Accordingly an embodiment of the present invention is directed to a shielding device, including: a base portion; and a tension wall, said tension wall being connected to the base portion, said tension wall configured for being directed toward the base portion when under tension, said tension wall forming one of: a planar surface and a clearance aperture for promoting access to the shielding device by surface mount technology (SMT) placement equipment, wherein the shielding device is an electromagnetic interference (EMI) shielding device.

A further embodiment of the present invention is directed to a shielding device, including: a base portion; and a tension wall, said tension wall being connected to the base portion, said tension wall configured for being directed toward the base portion when under tension, the tension wall including a plurality of finger portions, a first finger portion included in the plurality of finger portions, and a second finger portion included in the plurality of finger portions forming a first notch, a third finger portion included in the plurality of finger portions, and a fourth finger portion included in the plurality of finger portions forming a second notch, said tension wall forming one of: a planar surface and a clearance aperture for promoting access to the shielding device by surface mount technology (SMT) placement equipment, wherein the shielding device is an electromagnetic interference (EMI) shielding device.

A further embodiment of the present invention is directed to a shielding device, including: a base portion; and a tension wall, said tension wall being connected to the base portion, said tension wall configured for being directed toward the base portion when under tension, the tension wall including a plurality of finger portions, a first finger portion included in the plurality of finger portions, and a second finger portion included in the plurality of finger portions forming a first notch, a third finger portion included in the plurality of finger portions, and a fourth finger portion included in the plurality of finger portions forming a second notch, said tension wall forming one of: a planar surface and a cylindrically-shaped clearance aperture for promoting access to the shielding device by surface mount technology (SMT) placement equipment, said cylindrically-shaped clearance aperture configured for allowing access to the base portion of the shielding device by the SMT placement equipment, wherein the shielding device is an electromagnetic interference (EMI) shielding device.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 5 is an isometric view of an SMT EMI shielding device in accordance with a further exemplary embodiment of the present invention;

FIG. 6 is an isometric view of an SMT EMI shielding device in accordance with a still further exemplary embodiment of the present invention;

FIG. 7 is an end view of the SMT EMI shielding device shown in FIG. 5 or FIG. 6 in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

Figure 1:
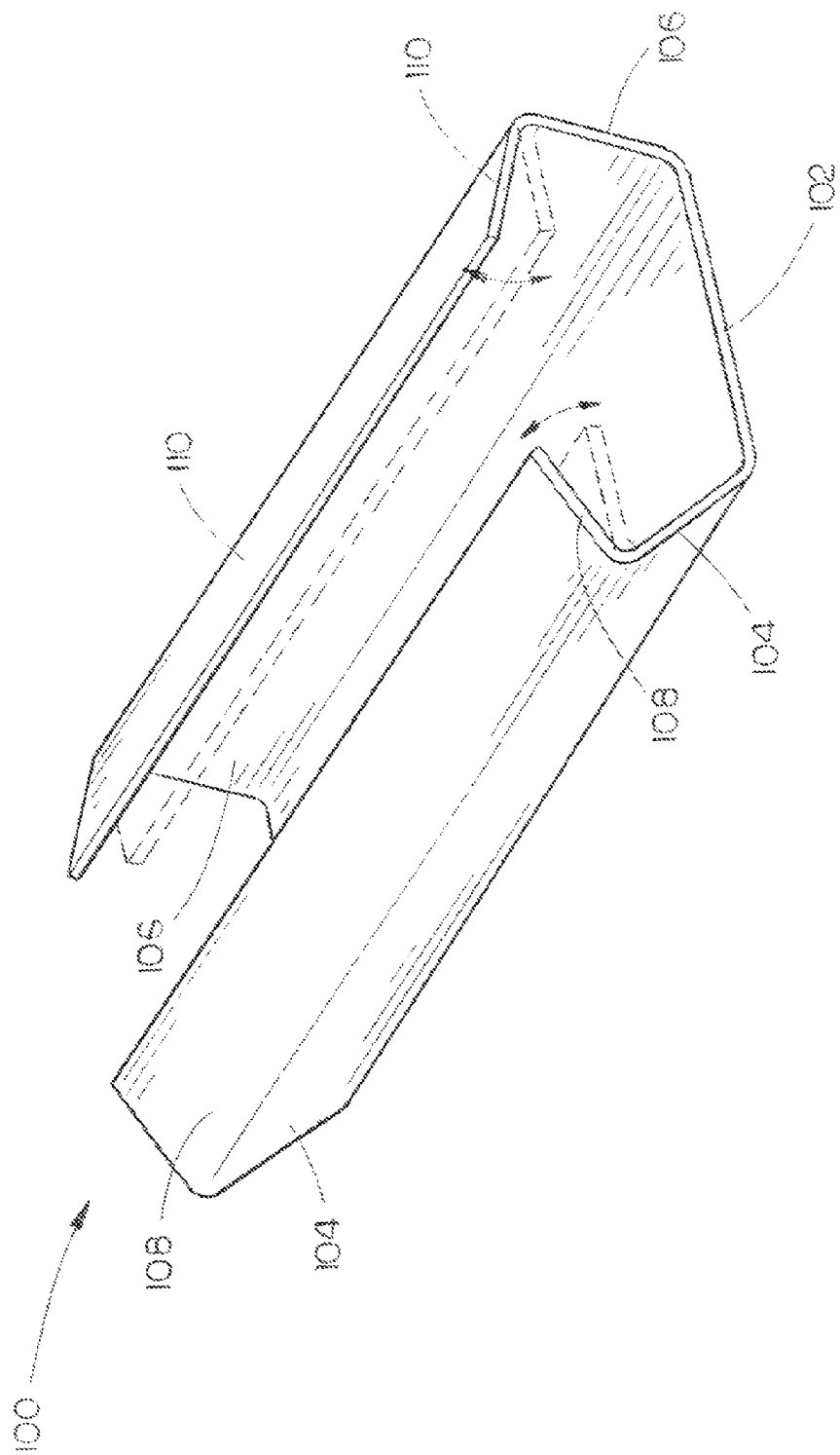
FIG. 1 is an isometric view of a SMT EMI shielding device (ex.—a miniature SMT EMI shielding device) in accordance with an exemplary embodiment of the present invention.

Referring to FIG. 1, a shielding device in accordance with an exemplary embodiment of the present invention is shown. For example, the shielding device 100 may be an Electromagnetic Interference (EMI) shielding device. In exemplary embodiments of the present invention, the shielding device 100 may be a Surface Mounted Component (SMC), which may be configured for being mounted directly onto a surface. For instance, the SMC 100 may be configured for being mounted directly onto a Printed Circuit Board (PCB) surface via Surface Mount Technology (SMT). In further embodiments of the present invention, said SMC 100 and PCB may collectively form and/or may be included as part of a Surface Mount Device (SMD). For example, the SMD may be an electronic circuit and/or electronic device.

In exemplary embodiments of the present invention, the EMI shielding device 100 may be a spring finger (as shown in FIG. 1) and/or a spring finger EMI gasket. In further embodiments of the present invention, the EMI spring finger 100 may be formed of Beryllium copper, stainless steel, and/or the like.

In current exemplary embodiments of the present invention, the SMT EMI spring finger 100 may be configured such that said spring finger 100 has a geometry (ex.—shape) and/or thickness suitable for allowing the spring finger 100 to accommodate tolerances and/or available compression forces which may be encountered in typical applications and/or typical implementations. As mentioned above, the EMI shielding spring finger 100 of the present invention may be configured for implementation in electronic devices. For example, the EMI shielding spring finger 100 may be configured for implementation in Distance Measuring Equipment, such as the DME-2100 which is manufactured by Rockwell Collins, Inc. Further, the EMI shielding spring finger 100 may be configured for implementation in Traffic Avoidance Systems and/or Traffic Collision Avoidance Systems (TCAS), such as the TTR-2100 which is manufactured by Rockwell Collins, Inc.

As mentioned above, the EMI shielding spring finger 100 of the exemplary embodiments of the present invention may be configured for accommodating tolerances and/or available compression forces which may be encountered in typical applications and/or typical implementations. For example, an application such as the DME-2100 or the TTR-2100 may require a design load of approximately seven pounds per spring finger 100. In exemplary embodiments of the present invention, the EMI shielding spring finger 100 may be configured such that its thickness allows for handling of such tolerances. However, the thickness of the material used to construct the EMI shielding spring finger 100 (exs.—the thickness of the spring finger 100, the thickness of walls of the spring finger 100) may be selected such that the spring finger 100 provides desired flexion and compression, while still being configured to accommodate application tolerances encountered in the environment within which the spring finger 100 is implemented. For instance, the thickness of the material used to construct the spring finger 100 may be inversely related to the compression range (ex.—flexion-compression) the spring finger 100 is able to provide.

As mentioned above, the SMT EMI spring finger (ex.—miniature SMT EMI shielding device) 100 may be configured such that said spring finger 100 has a geometry (ex.—shape) and/or thickness suitable for allowing the spring finger 100 to accommodate tolerances and/or available compression forces which may be encountered in typical applications and/or typical implementations. In at least one exemplary embodiment of the present invention, the SMT EMI spring finger 100 may be an elongated section of formed sheet metal. For instance, the spring finger 100 may be formed of Beryllium copper. As shown in FIG. 1, the spring finger 100 may include a base portion 102. In further embodiments of the present invention, the spring finger 100 may include a pair of side walls (104, 106), said side walls (104, 106) being connected to the base portion 102 of the spring finger 100. For instance, the sidewalls (104, 106) may each angle outward (ex.—away) from the base portion. In still further embodiments, the spring finger 100 may include a first tension wall 108 and a second tension wall 110. The first tension wall 108 may be connected to the first side wall 104, while the second tension wall 110 may be connected to the second side wall 106. For instance, the first tension wall 108 and the second tension wall 110 may each angle (ex.—extend) inward toward each other, but are spaced apart from each other. In exemplary embodiments of the present invention, the base portion 102, the side walls (104, 106) and the tension walls (108, 110) of the spring finger 100 may collectively form a generally-pentagonal shaped cross-section of formed sheet metal, as shown in FIG. 1). In alternative embodiments of the present invention, the spring finger 100 may be any one of various other shapes. In further embodiments of the present invention, the first tension wall 108 and the second tension wall 110 may be flexible, such that said first tension wall 108 and said second tension wall 110 may be biased toward the base portion 102 when tension is applied to them (which may draw the side walls 104, 106 inward (ex.—toward each other)) and may also be configured for biasing or expanding away from the base portion 102 when tension is not being applied to them (which may draw the side walls 104, 106 outward (ex.—away from each other).

In further embodiments of the present invention, as discussed above, the EMI spring finger 100 may be an EMI SMT spring finger 100 configured for being connected to a surface of an electronic device via SMT (Surface Mount Technology). For example, the SMT spring finger 100 may be configured such that compatibility of the SMT spring finger 100 with SMT processes and SMT equipment (ex.—automated equipment) is promoted. In exemplary embodiments of the present invention, at least one surface of the spring finger 100 (ex.—the base portion 102 of the spring finger 100) may be configured as a wide, flat (ex.—planar) surface which may allow the spring finger 100 to be more easily picked up and placed by the automated equipment (ex.—pick and place machines) implemented in SMT processes. In further embodiments of the present invention, the spring finger 100 may be configured for being packaged on a tape or reel which may be utilized in SMT processes. In still further embodiments of the present invention, the spring finger 100 may be sized such that it occupies a smaller footprint than currently available EMI shielding solutions, thereby reducing cost and promoting ease of manufacturability. For example, in the exemplary embodiment shown in FIG. 1, the spring finger 100 may have a width measurement (measured from the first sidewall 104 to the second sidewall 106) of approximately 0.081 inches and a height measurement (measured from the base portion 102 to the tension wall(s) (108, 110)) of approximately 0.040 inches.

In alternative embodiments of the present invention, the spring finger 100 may have different geometries than that shown in FIG. 1, as will be discussed below. In further embodiments of the present invention, the spring finger 100 may be formed of material having a thickness ranging from approximately 0.0020 inches to 0.0035 inches. In still further embodiments of the present invention, the spring finger 100 may be configured with laser etching, may include laser etching, and/or may be configured for being laser etched for promoting limiting of solder wetting, and thereby, promoting improved compression range of the spring finger 100.

Figure 2:
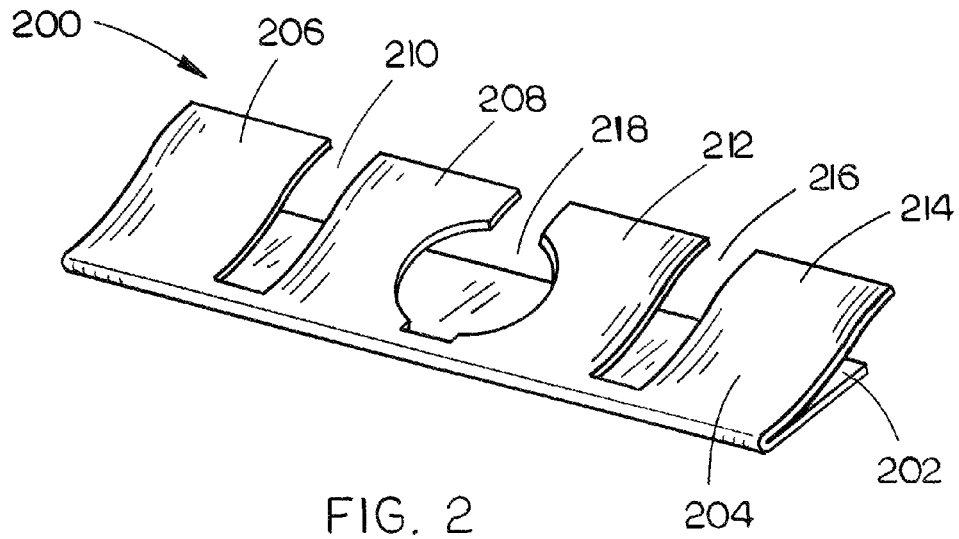
FIG. 2 is an isometric view of an SMT EMI shielding device in accordance with a further exemplary embodiment of the present invention.
Figure 4:
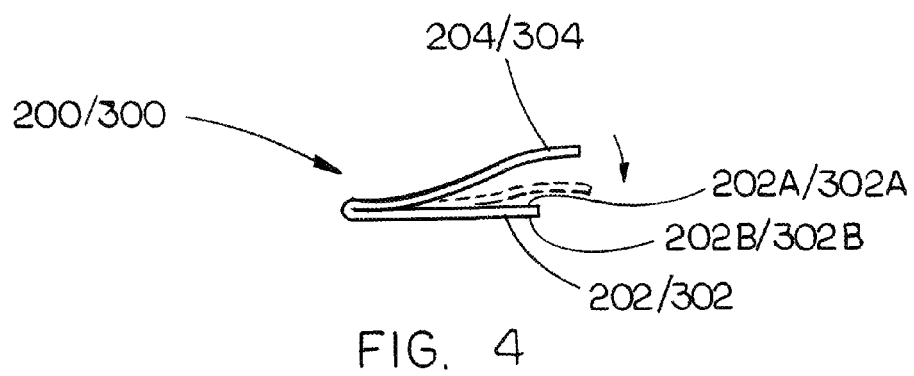
FIG. 4 is an end view of the SMT EMI shielding device shown in FIG. 2 or FIG. 3 in accordance with an exemplary embodiment of the present invention.

Referring to FIG. 2, a shielding device in accordance with a further exemplary embodiment of the present invention is shown. The shielding device 200 (ex.—EMI shielding device 200) shown in FIG. 2 may include one or more characteristics of the shielding device 100 discussed above. In current exemplary embodiments of the present invention, the shielding device 200 includes a base portion 202. For instance, the base portion 202 may include a planar (ex.—flat) surface. For example, the base portion 202 includes a mount surface 202A and a second surface 202B (as shown in FIG. 4), wherein the second surface 202B is on a side opposite the mount surface 202A. Further, the shielding device 200 includes a tension wall 204, the tension wall 204 being connected to the base portion 202. The tension wall 204 may be flexible, such that said tension wall 204 is configured for being biased toward the base portion 202 when tension is applied to said tension wall 204. For example, the tension wall 204 may be (ex.—is configured for being) directed against (ex.—pressed flat against) the base portion 202 when tension or force is applied to the tension wall 204 (as shown in FIG. 4). Further, the tension wall 204 may be configured for biasing away from (ex.—being biased away from) the base portion 202 when tension is not being applied to the tension wall 204.

Figure 8:
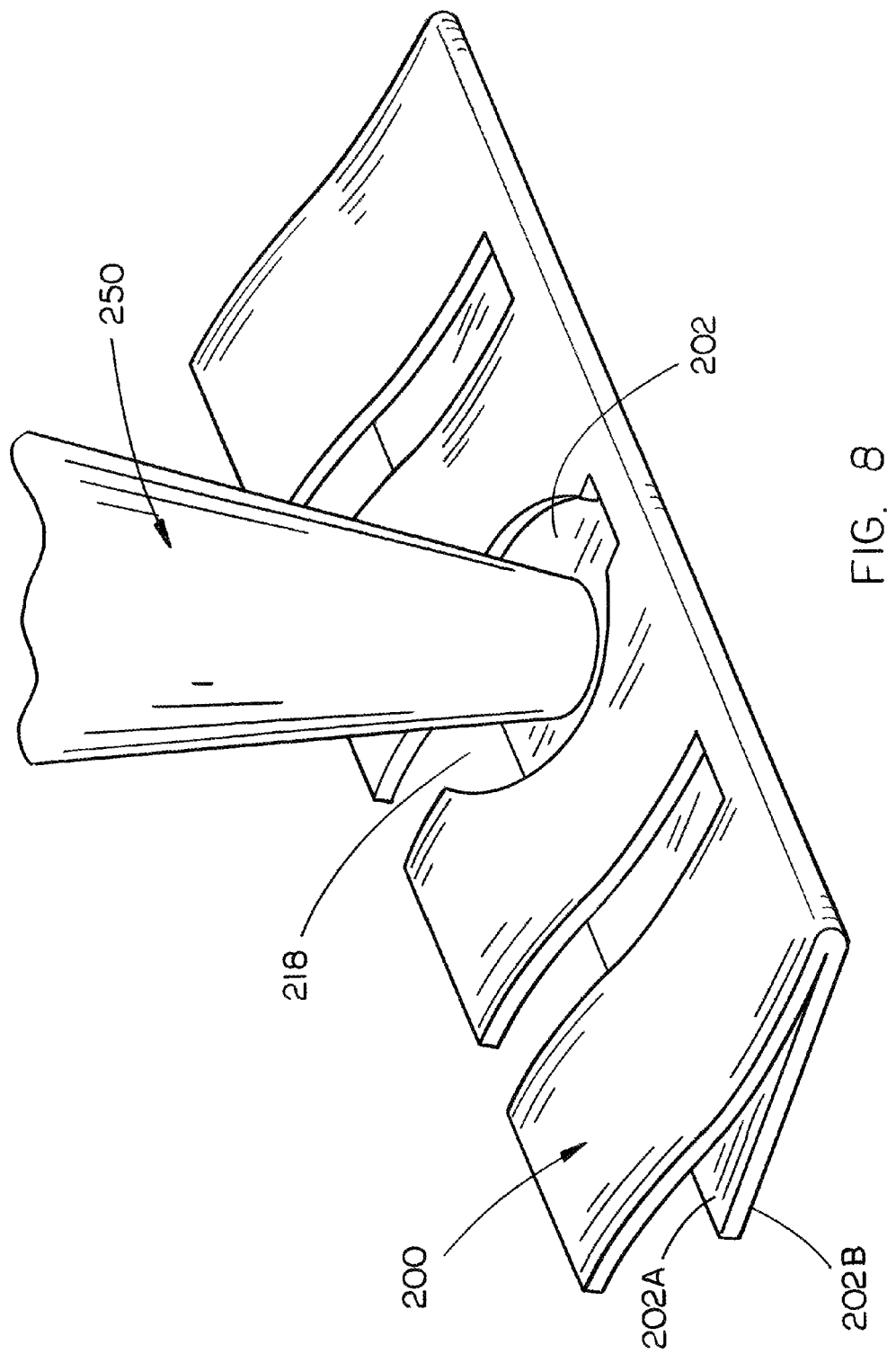
FIG. 8 is an isometric view of an SMT EMI shielding device in accordance with a further exemplary embodiment of the present invention.

The tension wall 204 of the shielding device 200 may form a plurality of finger portions. In the embodiment shown in FIG. 2, the tension wall 204 of the shielding device 200 may include and/or may form an even, non-zero number of finger portions. For instance, in the embodiment of the shielding device shown in FIG. 2, the tension wall 204 of the shielding device 200 may form four finger portions. A first finger portion 206 and a second finger portion 208 may form a first aperture (ex.—a first notch) 210, while a third finger portion 212 and a fourth finger portion 214 may form a second aperture (ex.—a second notch) 216. Further, the two innermost adjacent finger portions (ex.—the second finger portion 208 and the third finger portion 212) may form a clearance aperture 218. In exemplary embodiments of the present invention, the clearance aperture 218 is sized and shaped for allowing automated equipment implemented in SMT processes (ex.—a nozzle 250 of a pick and place machine) to have access to the base portion 202 so that said SMT nozzle 250 may pick up the shielding device 200 via the base portion 202 (as shown in FIG. 8). For instance, the clearance aperture 218 may be cylindrically-shaped for promoting ease of pick-up of the shielding device 200 (ex.—via the base portion 202) by the SMT nozzle 250.

Figure 3:
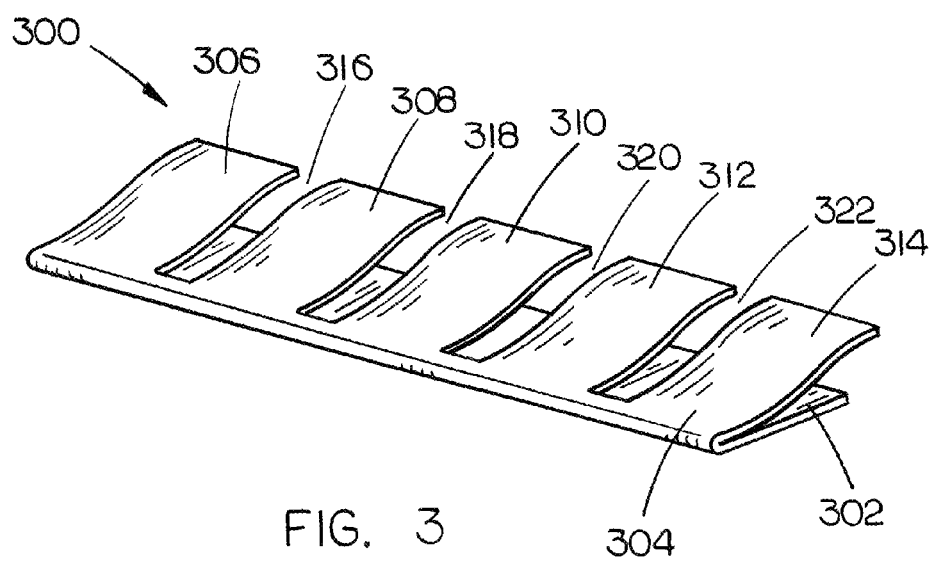
FIG. 3 is an isometric view of an SMT EMI shielding device in accordance with a still further exemplary embodiment of the present invention.

Referring to FIG. 3, a shielding device in accordance with a further exemplary embodiment of the present invention is shown. The shielding device 300 (ex.—EMI shielding device 300) shown in FIG. 3 may include one or more characteristics of one or more of the shielding devices (100, 200) discussed above. In current exemplary embodiments of the present invention, the shielding device 300 includes a base portion 302. For instance, the base portion 302 may include a planar (ex.—flat) surface. For example, the base portion 302 includes a mount surface 302A and a second surface 302B (as shown in FIG. 4), wherein the second surface 302B is on a side opposite the mount surface 302A. Further, the shielding device 300 includes a tension wall 304, the tension wall 304 being connected to the base portion 302. The tension wall 304 may be flexible, such that said tension wall 304 is configured for being biased toward the base portion 302 when tension is applied to said tension wall 304. For example, the tension wall 304 is configured for being directed against (ex.—pressed flat against) the base portion 302 when tension or force is applied to the tension wall 304 (as shown in FIG. 4). Further, the tension wall 304 may be configured for biasing away from (ex.—being biased away from) the base portion 302 when tension is not being applied to the tension wall 304.

The tension wall 304 of the shielding device 300 may form a plurality of finger portions. In the embodiment shown in FIG. 3, the tension wall 304 of the shielding device 300 may include and/or may form an odd, non-zero number of finger portions. For instance, in the embodiment of the shielding device shown in FIG. 3, the tension wall 304 of the shielding device 300 forms five finger portions (306, 308, 310, 312, 314). A first finger portion 306 and a second finger portion 308 form a first aperture (ex.—a first notch) 316, the second finger portion 308 and a third finger portion 310 form a second aperture (ex.—a second notch) 318, the third finger portion 310 and a fourth finger portion 312 form a third aperture (ex.—a third notch) 320, the fourth finger portion 312 and a fifth finger portion 314 form a fourth aperture (ex.—a fourth notch) 322. In exemplary embodiments of the present invention, the finger portions (306, 308, 310, 312, 314) (ex.—top exterior surface of the tension wall 304) of the shielding device 300 may be sized and shaped (ex.—may include flat spots) for promoting pick and place accessibility of the device 300 by automated equipment implemented in SMT processes. FIG. 4 is an end view diagram of the shielding device(s) (200, 300) described above. As shown in FIG. 4, the tension wall (204, 304) may be configured to extend past the base portion (202, 302) as shown in FIG. 4.

Referring to FIG. 5, a shielding device in accordance with a further exemplary embodiment of the present invention is shown. The shielding device 500 (ex.—EMI shielding device 500) shown in FIG. 5 may include one or more characteristics of one or more of the shielding devices (100, 200, 300) discussed above. In current exemplary embodiments of the present invention, the shielding device 500 includes a base portion 502. For instance, the base portion 502 may include a planar (ex.—flat) surface. For example, the base portion 502 includes a mount surface 502A and a second surface 502B (as shown in FIG. 7), wherein the second surface 502B is on a side opposite the mount surface 502A. Further, the shielding device 500 includes a tension wall 504, the tension wall 504 being connected to the base portion 502 via a curved wall portion 506. The tension wall 504 may be flexible, such that said tension wall 504 is configured for being directed (ex.—biased) toward the base portion 502 when tension is applied to said tension wall 504. However, because the shielding device 500 shown in FIG. 5 includes the curved wall portion 506, the tension wall 504 is configured so that it is resistant to being pressed flat against the base portion 502 when tension or force is applied to the tension wall 504. (as shown in FIG. 7). Further, the tension wall 504 may be configured for biasing away from (ex.—being biased away from) the base portion 502 when tension is not being applied to the tension wall 504. The device 500 may further be implemented with a compression stop (not shown) which may prevent the device from being pressed flat. The compression stop may be a separate component (ex.—part of the enclosure).

The tension wall 504 of the shielding device 500 may form a plurality of finger portions. In the embodiment shown in FIG. 5, the tension wall 504 of the shielding device 500 includes (ex.—forms) an even, non-zero number of finger portions. For instance, in the embodiment of the shielding device shown in FIG. 5, the tension wall 504 of the shielding device 500 may form four finger portions. A first finger portion 508 and a second finger portion 510 may form a first aperture (ex.—a first notch) 512, while a third finger portion 514 and a fourth finger portion 516 may form a second aperture (ex.—a second notch) 518. Further, the two innermost adjacent finger portions (ex.—the second finger portion 510 and the third finger portion 514) may form a clearance aperture 520. In exemplary embodiments of the present invention, the clearance aperture 520 is sized and shaped for allowing automated equipment implemented in SMT processes (ex.—a nozzle of an SMT pick-and-place machine) to have access to the base portion 502 so that said SMT nozzle may pick up the shielding device 500 via the base portion 502. For instance, the clearance aperture 520 may be cylindrically-shaped for promoting ease of pick-up of the shielding device 500 (ex.—via the base portion 502) by the SMT nozzle.

Referring to FIG. 6, a shielding device in accordance with a further exemplary embodiment of the present invention is shown. The shielding device 600 (ex.—EMI shielding device 600) shown in FIG. 6 may include one or more characteristics of one or more of the shielding devices (100, 200, 300, 500)

discussed above. In current exemplary embodiments of the present invention, the shielding device 600 includes a base portion 602. For instance, the base portion 602 may include a planar (ex.—flat) surface. For example, the base portion 602 includes a mount surface 602A and a second surface 602B (as shown in FIG. 7), wherein the second surface 602B is on a side opposite the mount surface 602A. Further, the shielding device 600 includes a tension wall 604, the tension wall 604 being connected to the base portion 602 via a curved wall portion 606. The tension wall 604 may be flexible, such that said tension wall 604 is configured for being directed (ex.—biased) toward the base portion 602 when tension is applied to said tension wall 604. However, because the shielding device 600 shown in FIG. 6 includes the curved wall portion 606, the tension wall 604 is configured so that it is resistant to being pressed flat against the base portion 602 when tension or force is applied to the tension wall 604. (as shown in FIG. 7). Further, the tension wall 604 may be configured for biasing away from (ex.—being biased away from) the base portion 602 when tension is not being applied to the tension wall 604. The device 600 may further be implemented with a compression stop (not shown) which may prevent the device from being pressed flat. The compression stop may be a separate component (ex.—part of the enclosure).

The tension wall 604 of the shielding device 600 may form a plurality of finger portions. In the embodiment shown in FIG. 6, the tension wall 604 of the shielding device 600 may include and/or may form an odd, non-zero number of finger portions. For instance, in the embodiment of the shielding device shown in FIG. 6, the tension wall 604 of the shielding device 600 forms five finger portions (608, 610, 612, 614, 616). A first finger portion 608 and a second finger portion 610 form a first aperture (ex.—a first notch) 618, the second finger portion 610 and a third finger portion 612 form a second aperture (ex.—a second notch) 620, the third finger portion 612 and a fourth finger portion 614 form a third aperture (ex.—a third notch) 622, the fourth finger portion 614 and a fifth finger portion 616 form a fourth aperture (ex.—a fourth notch) 624. In exemplary embodiments of the present invention, the finger portions (608, 610, 612, 614, 616) (ex.—top exterior surface of the tension wall 604) of the shielding device 600 may be sized and shaped (ex.—may include flat spots) for promoting pick and place accessibility of the device 600 by automated equipment implemented in SMT processes. FIG. 7 is an end view diagram of the shielding device(s) (500, 600) described above.

The above-described embodiments (ex—geometries) of the shielding devices (ex.—components) allow for a plurality of the shielding device(s) to be adjacently placed (ex.—via SMT assembly methods, SMT equipment) with minimal spacing, thereby allowing for continuous shielding of both internal and external partitions of a circuit card assembly (CCA) and enclosure. Further, effectivity at any frequency is dependent upon desired attenuation. Still further, a largest aperture (ex.—any dimension, any direction) formed by any of the shielding devices may be less than or equal to component-to-component spacing required for SMT placement. However, this may not be necessary for all embodiments and/or applications. For example, when a device (such as that shown in FIG. 2) is compressed (ex.—fully compressed, flattened) an aperture (ex.—the clearance aperture 218) which may have formerly been the largest aperture of the device (prior to the device 200 being fully compressed), may no longer be the largest aperture of the device 200 after the device 200 is fully compressed. Further, regarding the clearance aperture 520 of the device 500 of FIG. 5, the concept/design of the present invention may allow for the device (ex.—finger) 500 to be compressed enough such that electrical contact on a top surface 504 of device 500 occurs to the left of the clearance aperture 520, with the clearance aperture 520 therefore no longer being the largest aperture of the device 500. Thus, in either case, the presence of the clearance aperture 520 does not degrade performance of the shielding device 500 by increasing the largest aperture size.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system, comprising:
    surface mount technology placement equipment;
    a circuit card assembly;
    an enclosure; and
    a plurality of shielding devices, wherein each shielding device includes:
        a base portion, the base portion including a mount surface and second surface, wherein the mount surface of the base portion is configured to mount to at least one of an electronic component or a circuit board; and
        a wall, said wall being connected to the base portion, said wall comprising a curved portion and one or more substantially planar portions, wherein the curved portion of said wall transitions to the one or more substantially planar portions of said wall, the one or more substantially planar portions including a plurality of finger portions, wherein a line normal to a surface of one of the one or more substantially planar portions of said wall intersects the mount surface and the second surface of the base portion, wherein the second surface faces the one or more substantially planar portions of the wall, wherein at least a portion of said wall is configured to bend toward the base portion in response to a force acting on at least one of the one or more substantially planar portions of said wall, wherein at least one of the one or more substantially planar portions of said wall form a clearance aperture configured to provide surface mount technology placement equipment access to the second surface of the base portion of each shielding device, the clearance aperture being positioned above the second surface of the base portion,
    wherein a first finger portion included in the plurality of finger portions and a second finger portion included in the plurality of finger portions form a first notch,
    wherein a third finger portion included in the plurality of finger portions and a fourth finger portion included in the plurality of finger portions form a second notch,
    wherein the second finger portion and the third finger portion of the wall form the clearance aperture,
    wherein the clearance aperture is configured to allow access to the second surface of the base portion of each shielding device via said clearance aperture,
    wherein the clearance aperture is a cylindrically-shaped clearance aperture configured to allow a surface mount technology pick-and-place equipment nozzle to access to the second surface of the base portion of each shielding device, wherein each shielding device is constructed of Beryllium Copper and wherein the base portion and the wall have a thickness of 0.0020 inches to 0.0035 inches, wherein the shielding device further includes a compression stop, wherein the surface mount technology placement equipment is attached to the second surface of the base portion of at least one of the plurality of shielding devices, wherein a portion of the surface mount technology placement equipment passes through the clearance aperture, wherein each of the plurality of shielding devices is an electromagnetic interference (EMI) shielding device, wherein the plurality of shielding devices are adjacently placed to provide continuous shielding for the circuit card assembly.

2. The system as claimed in claim 1, wherein the base portion and the wall are connected via a curved wall portion.

3. The system as claimed in claim 1, wherein the plurality of shielding devices are implemented in distance measuring equipment.

4. The system as claimed in claim 1, wherein the plurality of shielding devices are implemented in a traffic avoidance system.

5. The system as claimed in claim 1, wherein the plurality of shielding devices are implemented in a traffic collision avoidance system.

6. A shielding device, comprising:
a base portion, the base portion including a mount surface and second surface, wherein the mount surface of the base portion is configured to mount to at least one of an electronic component or a circuit board; and
a wall, said wall being connected to the base portion, said wall comprising a curved portion and a plurality of finger portions, wherein the curved portion of said wall transitions to the plurality of finger portions of said wall, wherein the plurality of finger portions of said wall extend from the curved portion of said wall over the base portion, wherein a line normal to a surface of one of the plurality of finger portions intersects the mount surface and the second surface of the base portion, wherein the second surface faces the plurality of finger portions of the wall, wherein at least a portion of said wall is configured to bend toward the base portion in response to a force acting on at least one of the plurality of finger portions of said wall, wherein the plurality of finger portions includes at least a first finger portion, a second finger portion, a third finger portion, and a fourth finger portion, wherein the first and second finger portion form a first notch, wherein the third and fourth finger portion form a second notch, and wherein the second and third finger portions form a cylindrically-shaped clearance aperture configured to provide surface mount technology placement equipment access to the second surface of the base portion of the shielding device, the clearance aperture being positioned above the second surface of the base portion, wherein the shielding device is constructed of Beryllium Copper and wherein the base portion and the wall have a thickness of 0.0020 inches to 0.0035 inches, wherein the shielding device further includes a compression stop, wherein the surface mount technology placement equipment is attached to the second surface of the base portion of the shielding device, wherein a portion of the surface mount technology placement equipment passes through the clearance aperture, wherein the shielding device is an electromagnetic interference (EMI) shielding device.

7. The shielding device as claimed in claim 6, wherein the base portion and the wall are connected via a curved wall portion.

8. The shielding device as claimed in claim 6, wherein the plurality of finger portions of said wall extend from the curved portion of said wall over the base portion and extend past an edge of the base portion.

* * * * *